United States Patent
Findeklee et al.

(10) Patent No.: US 9,733,324 B2
(45) Date of Patent: Aug. 15, 2017

(54) MAGNETIC RESONANCE IMAGING SYSTEM WITH A MULTI-CHANNEL IMPEDANCE MATCHING NETWORK

(75) Inventors: Christian Findeklee, Hamburg (DE); Peter Vernickel, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 710 days.

(21) Appl. No.: 14/130,379

(22) PCT Filed: Jun. 21, 2012

(86) PCT No.: PCT/IB2012/053145
§ 371 (c)(1),
(2), (4) Date: Dec. 31, 2013

(87) PCT Pub. No.: WO2013/008116
PCT Pub. Date: Jan. 17, 2013

(65) Prior Publication Data
US 2014/0139218 A1   May 22, 2014

(30) Foreign Application Priority Data

Jul. 4, 2011 (EP) .................................... 11172468

(51) Int. Cl.
G01R 33/36       (2006.01)
G01R 33/3415    (2006.01)
G01R 33/565     (2006.01)

(52) U.S. Cl.
CPC ...... *G01R 33/3628* (2013.01); *G01R 33/3415* (2013.01); *G01R 33/365* (2013.01); *G01R 33/3635* (2013.01); *G01R 33/5659* (2013.01)

(58) Field of Classification Search
CPC ............ G01R 33/3628; G01R 33/3415; G01R 33/3635; G01R 33/365; G01R 33/5659
See application file for complete search history.

(56) References Cited

U.S. PATENT DOCUMENTS

| 4,827,219 A | 5/1989 | Harrison |
| 4,897,604 A | 1/1990 | Carlson |

(Continued)

FOREIGN PATENT DOCUMENTS

| DE | 3728863 A1 | 3/1989 |
| GB | 2283327 A | 5/1995 |

(Continued)

OTHER PUBLICATIONS

Vernickel et al "Active Digital Decoupling for Multi-Channel Transmit MRI Systems" Proc. Intl. Soc. Mag. Reson. Med. 15 (2007) p. 170.

*Primary Examiner* — Gregory H Curran

(57) ABSTRACT

The Magnetic Resonance Imaging (MRI) system includes a radio-frequency transmitter with multiple transmit channels. The MRI system includes an impedance matching network (320, 1402, 1502, 1602) for matching the radio-frequency transmitter to a remotely adjustable radio-frequency antenna (310, 1504, 1602) with multiple antenna elements (312, 314, 316, 318, 1404). The MRI system includes a processor (336) for controlling the MRI system. The execution of the instructions by the processor causes it to: measure (100, 200) a set of radio-frequency properties (352) of the radio-frequency antenna, calculate (102, 202) a matching network command (354) using the set of radio-frequency properties and a radio frequency model (366), and adjust (104, 204) the impedance matching network by sending the matching network command to the impedance matching network, thereby enabling automatic remote impedance matching.

18 Claims, 14 Drawing Sheets

(56) References Cited

U.S. PATENT DOCUMENTS

| | | |
|---|---|---|
| 5,036,426 A | 7/1991 | Shen |
| 5,483,158 A | 1/1996 | Heteren |
| 5,670,881 A | 9/1997 | Arakawa |
| 6,184,684 B1 | 2/2001 | Dumoulin |
| 6,477,398 B1 * | 11/2002 | Mills .................. G01R 33/16 324/201 |
| 7,221,160 B2 | 5/2007 | Leussler |
| 7,282,915 B2 | 10/2007 | Giaquinto |
| 7,336,074 B2 | 2/2008 | Yang |
| 7,385,396 B2 | 6/2008 | Zhu |
| 7,598,739 B2 | 10/2009 | Vaughan |
| 7,692,427 B2 | 4/2010 | Lee |
| 7,800,369 B2 | 9/2010 | Zhang |
| 8,981,774 B2 | 3/2015 | Leussler |
| 2007/0273377 A1 | 11/2007 | Yang |
| 2009/0076377 A1 | 3/2009 | Findekelee |
| 2009/0079432 A1 | 3/2009 | Pinkerton |
| 2009/0230956 A1 | 9/2009 | Finnigan |
| 2009/0237077 A1 | 9/2009 | Vaughan |
| 2010/0066370 A1 | 3/2010 | Clark |
| 2011/0043209 A1 | 2/2011 | Zhu |
| 2012/0032678 A1 | 2/2012 | Vaughan |

FOREIGN PATENT DOCUMENTS

| | | |
|---|---|---|
| JP | 0950158 A | 2/1997 |
| WO | 2007124247 A1 | 11/2007 |
| WO | 2010018535 A1 | 2/2010 |
| WO | 2010045457 A2 | 4/2010 |
| WO | 2011033400 A1 | 3/2011 |
| WO | 2011148278 A1 | 12/2011 |

\* cited by examiner

MAGNETIC RESONANCE IMAGING SYSTEM WITH A MULTI-CHANNEL IMPEDANCE MATCHING NETWORK

CROSS-REFERENCE TO PRIOR APPLICATIONS

This application is the U.S. National Phase application under 35 U.S.C. §371 of International Application No. PCT/IB2012/053145, filed on Jun. 21, 2012, which claims the benefit of European Patent Application No. 11172468.8, filed on Jul. 4, 2011. These applications are hereby incorporated by reference herein.

TECHNICAL FIELD

The invention relates to magnetic resonance imaging, in particular to magnetic resonance imaging systems with multiple radio-frequency transmit channels.

BACKGROUND OF THE INVENTION

A magnetic field is used in Magnetic Resonance Imaging to align the nuclear spins of atoms as part of the procedure for producing images within the body of a patient. This magnetic field is referred to as the B0 field. During an MRI scan, Radio Frequency (RF) pulses generated by a transmitter or amplifier and an antenna cause perturbations to the local magnetic field and can be used to manipulate the orientation of the nuclear spins relative to the B0 field. RF signals emitted by the nuclear spins are detected by a receiver coil, and these RF signals are used to construct the MRI images.

Parallel Transmit Magnetic Resonance Imaging (MRI) systems may have multiple transmit and receive channels. The antenna may comprise multiple antenna elements, each of which is connected to a transmitter and/or receiver.

U.S. Pat. No. 7,282,915 discloses a receive only RF imaging coil. The RF imaging coil has a plurality of distributed capacitors positioned selectively about each coil element. The values of the distributed capacitors are adjusted so as to tune each coil element to the MRI frequency with all the coil assemblies assembled and with the sample or subject present in the sample space.

SUMMARY OF THE INVENTION

The invention relates to a magnetic resonance imaging system, a computer program product, a method, and a radio-frequency antenna in the independent claims. Embodiments are given in the dependent claims.

In Magnetic Resonance Imaging there is a clear trend to design antenna arrays for the RF transmission and reception. The power efficiency of such arrays depends on the loading, i.e. on the size of the patient and the body region to be imaged. Currently multi-element antennas are tuned so that it functions with a variety of subjects. However, the positioning and size of a particular subject relative to the antenna elements may affect their scattering matrix S, i.e., input reflections and transmission coefficients with respect to the feeding ports. Embodiments of the invention may solve this problem and others by actively modifying or impedance matching the transmit array or antenna depending on the loading condition to achieve an efficient use of the power applied.

There is also radio-frequency coupling between the individual antenna elements. The radio-frequency power applied to one antenna element may couple to another element. To compensate for this, embodiments of the invention may characterize the radio-frequency antenna. This characterization of the radio-frequency antenna constitutes a set of radio-frequency properties which can then be used with a radio-frequency model to calculate how the impedance matching network should be adjusted. The radio-frequency model may either be a model which uses the set of radio-frequency properties to model the impedance matching network and radio-frequency antenna or it may be a set of parameters which characterize the present state of the antenna and its matching network.

In another embodiment execution of the instructions causes the processor to acquire a magnetic field map using the magnetic resonance imaging system. For instance the magnetic field map may be a B1 field map for each antenna element that was acquired using the magnetic resonance imaging system. The radio-frequency properties are at least partially measured using the magnetic field map. For instance the strength of the B1 field generated by a coil element may be proportional to or related to the radio-frequency current through the coil element. As a result, the B1 field could be used to determine the current or even the voltage applied to the coil element.

In multi channel magnetic resonance imaging systems, each antenna element may be driven with radio-frequency power that has a different amplitude and phase. The amplitude and phase may be selected to perform among other things like B1 shimming, i.e. improving the $B_{1+}$ homogeneity, or reduction of the Specific Absorption Ration (SAR) for whole body imaging. This amplitude and phase may be referred to as a drive vector, B1 shim setting, or shim setting. The appropriate drive vector may change depending upon the subject, the subject position, and the type of magnetic resonance imaging procedure performed, in particular the region being imaged. Each of the antenna elements are impedance matched to a radio-frequency channel using an impedance matching network. For each drive vector the impedance matching network may need to be adjusted.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. the memory may also be multiple memories distributed amongst multiple computer systems or computing devices.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to 'computer storage' or 'storage' should be interpreted as possibly being multiple storage. The storage may for instance be multiple storage devices within the same computer system or computing device. The storage may also be multiple storages distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses a interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system for acquiring magnetic resonance data. The magnetic resonance imaging system comprises a radio-frequency transmitter with multiple transmit channels for generating radio-frequency pulses during acquisition of the magnetic resonance data. In acquiring the magnetic resonance data typically a large magnetic field is used to align magnetic spins in atoms or molecules. Next, magnetic gradient coils are used to generate gradient fields which are used for spatially encoding the spins. Finally the radio-frequency antenna is used to transmit radio-frequency pulses which are used for manipulating the orientation of the magnetic spins. The same or a different antenna may be used to receive radio-frequency emissions from the spins.

The magnetic resonance imaging system comprises or includes an impedance matching network adapted for impedance matching the radio-frequency transmitter to a radio-frequency antenna. The matching network may comprise or include several matching circuits for each antenna port to control the impedance at each port, or to control the S-matrix.

The radio-frequency antenna comprises multiple antenna elements. The impedance matching network is adjustable remotely. By adjustable remotely it is meant that the impedance matching network may be controlled from a distance. This may include electronic control of the impedance matching network and also remote mechanical adjustment of components of the impedance matching network. For instance an impedance matching network could be controlled by such things as a pin diode which would be an example of electronic control or it may be controlled for instance by adjustable capacitors which would be an example of a mechanical adjustment of the impedance matching network.

The radio-frequency transmitter, the impedance matching network, and the radio-frequency antenna may all have the same number of channels or elements. In other embodiments the radio-frequency transmitter, the radio-frequency antenna and the impedance matching network have a different number of channels or elements. For instance a multiplexer may be connected between the radio-frequency transmitter and the impedance matching network and/or a multiplexer may be connected between the impedance matching network and the radio-frequency antenna. The magnetic resonance imaging system further comprises a memory for storing machine executable instructions.

In another embodiment the matching network may have interconnections between at least two ports allowing a defined (in magnitude and phase) transfer of power among channels.

The magnetic resonance imaging system further comprises or includes a processor for executing the machine executable instructions. The processor is adapted for controlling the magnetic resonance imaging system.

Execution of the instructions causes the processor to measure a set of radio-frequency properties of the radio-frequency antenna. That is to say a signal is transmitted using the radio-frequency transmitter and measurements are made which allow the processor to measure a set of radio-frequency properties. The radio-frequency properties characterize the multi-element antenna. The radio-frequency properties may be measured in different ways in different embodiments. For instance a radio-frequency receiver could be used to simultaneously measure the transmitted signals while the radio-frequency transmitter is emitting. Alternatively the reflection may be measured using directional couplers. In this case the magnetic resonance imaging system may have a network analyzer-like functionality. In other embodiments sensors are distributed within the radio-frequency chain and are used to measure the set of radio-frequency properties. The MRI system could also acquire magnetic field information using MR-methods to be used as radio frequency properties.

Execution of the instructions further causes the processor to calculate a matching network command using the set of radio-frequency properties and a radio-frequency model. The radio-frequency model is descriptive of the impedance matching network and the radio-frequency antenna. For instance the radio-frequency model may be a SPICE or other model which allows the precise modeling of the impedance (matrix) properties and field generator of the radio-frequency coil. The matching network command is a command or instruction, possibly a set of commands or set of instructions, which cause the impedance matching network to be adjusted remotely. Execution of the instructions further cause the processor to adjust the impedance matching network by sending the matching network commands to the impedance matching network.

This embodiment may be particularly beneficial because it is advantageous to impedance match the radio-frequency antenna when acquiring magnetic resonance data. The measurement of the radio-frequency properties and the calculation of the matching network commands using the measured set of radio-frequency properties and the radio-frequency model enables the accurate adjustment of the impedance matching network. In a magnetic resonance imaging system with multiple transmit and/or receive channels the transmission and matching of one channel affects the transmissions and matching of other channels (due to residual coupling). The apparatus as outlined enables the accurate impedance matching network in spite of these changes and transmissions on other channels.

In another embodiment the magnetic resonance imaging system further comprises a radio-frequency receiver for acquiring the magnetic resonance data using the radio-frequency antenna. The radio-frequency receiver has one or multiple receive channels. The multiple receive channels may have the same number as the multiple transmit channels or they may be a different number. For instance a multiplexer may be used where there is a different number of transmit and receive channels. If B1 mapping is used to measure the magnetic field generated by a coil only a single receiver is needed.

In another embodiment the magnetic resonance imaging system further comprises a radio-frequency generator. The radio-frequency properties are at least partially measured using radio-frequency transmitter. The radio-frequency generator may be used to generate radio-frequency signals which can be detected by a radio-frequency receiver, external sensors, field probes, or B1 measurements of the magnetic field using the magnetic resonance imaging system. In some embodiments the radio-frequency generator is identical with the radio-frequency transmitter. In other embodiments the radio-frequency generator is a generator that is separate from the radio-frequency frequency transmitter. The radio-frequency generator may also be a component of a network analyzer.

In another embodiment the magnetic resonance imaging system further comprises a network analyzer. The radio-frequency properties are at least partially measured using the network analyzer. The network analyzer may be for instance connected into the radio-frequency chain using a switch.

In another embodiment the magnetic resonance imaging system further comprises a radio-frequency properties measuring means for measuring the radio-frequency properties. The radio-frequency properties are at least partially measured using the radio-frequency measuring means. A radio-frequency properties measuring means as used herein in encompasses any means which may be used for characterizing the radio-frequency properties of the antenna. This may include, but is not limited to: a network analyzer, radio-frequency test equipment, sensors distributed within the RF chain, magnetic field sensors, and/or the magnetic resonance imaging system itself.

The radio-frequency transmitter and the radio-frequency receiver are configured for simultaneous transmissions on at least one of the multiple transmit channels and simultaneous receptions on at least one of the multiple receive channels. The set of radio-frequency properties comprise an S-matrix or scattering matrix measured using the at least one of the multiple transmit channels and using the at least one multiple receive channels. This embodiment may be advantageous because the simultaneous transmission and reception enables the magnetic resonance imaging system to function in a network analyzer-like way and measure the S-matrix. In conjunction with a radio-frequency model the S-matrix may be used to accurately calculate the matching network command.

In another embodiment the impedance matching network is further adapted for impedance matching the radio-frequency receiver to the radio-frequency antenna.

In another embodiment the magnetic resonance imaging system comprises a set of radio-frequency sensors. The radio-frequency properties are measured at least using the set of radio-frequency sensors. This embodiment may be beneficial because the measurement of the radio-frequency properties using the radio-frequency sensors allows the radio-frequency properties of the radio-frequency antenna to be characterized. The radio frequency sensors could for instance be used when the radio-frequency transmitter or a radio-frequency generator is generating a radio-frequency signal.

In another embodiment the magnetic resonance imaging system uses B1 mapping techniques to measure the response of the multi element transmit coil.

In another embodiment execution of the instructions further causes the processor to determine a B1 shim settings for the radio-frequency transmitter using the magnetic resonance imaging system. A B1 shim setting as used herein encompasses is a complex vector comprising amplitudes and phases of all excitations in each transmit channel. The processor may send commands to the magnetic resonance imaging system which cause it to acquire data which may be used to calculate B1 shim settings for i.e. homogeneous excitation in a given field of interest (FOI). Execution of the instructions further causes the processor to calculate a power loss using the set of radio-frequency properties and the B1 shim settings. Execution of the instructions further causes the processor to choose a matching network adjustment. The matching network is adjustable. The matching network adjustment is a change in the settings or mechanical position of matching network components.

Execution of the instructions further causes the processor to transform the set of radio-frequency properties and the B1 shim settings using the radio-frequency model and the matching network adjustment. A change in the matching network will change the radio-frequency properties and the B1 shim settings. Using the radio-frequency model these changes may be calculated. Execution of the instructions further causes the processor to calculate a changed power loss using the transformed set of radio-frequency properties and the transformed B1 shim settings. The matching network command is calculated in accordance with the matching network adjustment if the changed power loss is smaller than the power loss. This embodiment may be beneficial because it provides a means of determining matching network settings which lead to the efficient radio-frequency emissions from the antenna.

In another embodiment execution of the instructions further causes the processor to re-determine the B1 shim settings and re-measure the set of radio-frequency properties. The model was used to calculate the transformed value of the radio-frequency properties and the transformed B1 shim settings. After the final matching network adjustment is determined or even during an iterative process these calculated values can be checked against measurements made using the magnetic resonance imaging system.

In another embodiment the power loss is a relative power loss and the changed power loss is a changed relative power loss.

In another embodiment execution of the instructions causes the processor to iteratively repeat the choosing of a matching network adjustment and calculation of the changed power loss. For instance the matching network adjustment may be repeatedly calculated until the change in the power loss is below a predetermined threshold.

In another embodiment the impedance matching network is configured to couple at least one pair of the multiple antenna elements. The coupling between the at least one pair is remotely adjustable. This embodiment may be beneficial because transmissions on one antenna element may affect other antenna elements. The coupling may be adjusted in different ways. For instance there may be a resistance or real impedance, a capacitive or capacitor may be used to provide the coupling, an adjustable impedance may be used to adjust the coupling, or combinations thereof may be used. For instance a simple network may be used to join pairs of channels going to the multiple antenna elements. This embodiment may be beneficial because it may provide better impedance matching of the radio-frequency antenna.

In another embodiment the step of calculating the matching network command comprises instructions for adjusting the coupling between the at least one pair. This embodiment may be beneficial because the adjustable coupling between the multiple antenna elements is modeled in the radio-frequency model and this is used to properly adjust the impedance matching network. This may be performed as an iterative process where the matching network is adjusted, including adjusting the coupling, is alternated with acquiring magnetic resonance data for reconstructing images.

In another embodiment the instructions for adjusting the coupling between the at least one pair cause the coupling between the at least one pair to be changed. The coupling has an amplitude and a phase. Changing the amplitude and/or the phase will change the degree of coupling between two channels.

In another embodiment the magnetic resonance imaging system comprises the radio-frequency antenna.

In another embodiment the magnetic resonance imaging system comprises a magnet with a main field. A main field as used herein encompasses a magnetic field which is strong enough and uniform enough to perform magnetic resonance imaging. The impedance matching network is located outside of the main field. This may for instance include the instance where a portion of the impedance matching network is located on or near the antenna. For instance a half or quarter wavelength transmission line may be used to connect an element of the radio-frequency antenna to a matching network or a sub-matching network.

In another embodiment the impedance matching network is integrated into the radio-frequency coil.

In another embodiment the impedance matching network comprises a set of separate matching networks each connected between one of the multiple transmit and receive channels and one of the multiple antenna elements. In this embodiment the impedance matching network for the multi-channel system is comprised of individual and possibly simpler matching networks. This may enable the expanding of the number of radio-frequency channels used in the magnetic resonance imaging system.

In another embodiment execution of the instructions further causes the processor to acquire the magnetic resonance data using the magnetic resonance imaging system. The magnetic resonance data is acquired after the impedance matching network has been adjusted. This is advantageous because the images or the magnetic resonance data that has been acquired was acquired after the radio-frequency antenna has been properly impedance matched. This may improve the image quality. In some embodiments the acquisition or measurement of the radio-frequency properties and the acquisition of magnetic resonance data is iterative. Periodically during the use of the magnetic resonance imaging system the set of radio-frequency properties may be measured or re-measured to ensure that all of the magnetic resonance data acquired is of the best quality.

The invention provides for a magnetic resonance imaging system for acquiring magnetic resonance data. The magnetic resonance imaging system comprises or includes a radio-frequency transceiver for generating radio-frequency pulses during acquisition of magnetic resonance data. The radio-frequency transceiver has multiple transmit and receive channels. The radio-frequency transceiver is adapted for simultaneous transmission and reception on each of the multiple transmit and receive channels. Alternatively, the radio-frequency properties may be measured with an other piece of hardware or sensors.

The magnetic resonance imaging system further comprises an impedance matching network adapted for impedance matching the radio-frequency transceiver to a radio-frequency antenna. The radio-frequency antenna comprises multiple antenna elements. The radio-frequency transceiver has a channel chosen from the multiple transmit and receive channels for each of the multiple antenna elements. In alternative embodiments, the number of channels in the antenna might also be higher than the number of transmission channels. In this case, power splitters and/or combiners can be used for example. The impedance matching network is adjustable remotely.

In another embodiment the magnetic resonance imaging system further comprises a memory for storing machine executable instructions in a processor for executing the machine executable instructions. The processor is adapted for controlling the magnetic resonance imaging system. Execution of the instructions causes the processor to measure an S-matrix (scattering matrix) for the radio-frequency antenna using e.g. the radio-frequency transceiver. In alternative embodiments, the invention may be realized without measuring the S-matrix. For examples field maps acquired with MRI-techniques may be used instead. Important information may also be provided for or measured by at least one data set of:

Field maps (B1-maps) of the single coil elements,
S-matrix of the coil,
Field probe measurements of the individual elements (Field sensitivity matrix), and
Current measurements of the individual elements (current sensitivity matrix)

Execution of the instructions further causes the processor to calculate a matching network command using the S-matrix and a radio-frequency model. The radio model is descriptive of the impedance matching network and the radio-frequency antenna. Execution of the instructions further causes the processor to adjust the impedance matching network by sending the matching network command to the impedance matching network.

In another aspect the invention provides for a computer program product comprising machine executable instructions. The machine executable instructions are for execution by a processor controlling the magnetic resonance imaging system for acquiring magnetic resonance data. The magnetic resonance imaging system comprises a radio-frequency transmitter for generating radio-frequency pulses during acquisition of the magnetic resonance data. The radio-frequency transmitter has multiple transmit channels. The magnetic resonance imaging system further comprises an impedance matching network adapted for impedance matching the radio-frequency transmitter to a radio-frequency antenna. The radio-frequency antenna comprises multiple antenna elements. The impedance matching network is adjustable remotely.

Execution of the instructions causes the processor to measure a set of radio-frequency properties of the radio-frequency antenna. Execution of the instructions further causes the processor to calculate a matching network command using the set of radio-frequency properties and a radio-frequency model. The radio-frequency model is descriptive of the impedance matching network and the radio-frequency antenna. Execution of the instructions further causes the processor to adjust the impedance matching network by sending the matching network command to the impedance matching network. In another aspect the invention provides for a method of operating a magnetic resonance imaging system for acquiring magnetic resonance data. The magnetic resonance imaging system comprises a radio-frequency transmitter for generating radio-frequency pulses during acquisition of the magnetic resonance data. The radio-frequency transmitter has multiple transmit channels.

The magnetic resonance imaging system further comprises an impedance matching network adapted for impedance matching the radio-frequency transmitter to a radio-frequency antenna. The radio-frequency antenna comprises multiple antenna elements. The impedance matching network is adjustable remotely. Execution of the instructions causes the processor to measure a set of radio-frequency properties of the radio-frequency antenna. Execution of the instructions further causes the processor to calculate a matching network command using the set of radio-frequency properties and a radio-frequency model. The radio-frequency model is descriptive of the impedance matching network and the radio-frequency antenna. Execution of the instructions further causes the processor to adjust the impedance matching network by sending the matching network command to the impedance matching network.

In another embodiment the magnetic resonance imaging system comprises a magnet with an imaging zone. The magnetic resonance imaging system is acquired from the imaging zone. The method further comprises the step of placing a subject at least partially within the imaging zone before measuring the set of radio-frequency properties. This embodiment may be particularly beneficial because when a subject is placed within the imaging zone in the vicinity of the radio-frequency antenna this may cause the impedance of the radio-frequency antenna to change. Matching the impedance of the radio-frequency antenna to the radio-frequency transmitter while the subject is in place may result in better impedance matching and therefore higher image quality.

It should be noted that the magnetic resonance data is primarily acquired from the imaging zone. However, Fourier methods are used typically for image construction using the magnetic resonance data. For this reason magnetic spins outside of the imaging zone may affect the image. Therefore, although the region of interest for imaging is within the imaging zone magnetic spins outside of the imaging zone also have their magnetic resonance data acquired.

In another aspect the invention provides for a radio-frequency antenna configured for acquiring magnetic resonance data. The radio-frequency antenna comprises multiple antenna elements. The multiple antenna elements are configured for transmitting. In some embodiments the multiple antenna elements are configured for transmitting and receiving. The radio-frequency antenna comprises or includes an impedance matching network. The impedance matching network is remotely controllable. The impedance matching network is configured to connect to a radio-frequency transmitter with multiple transmit channels.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
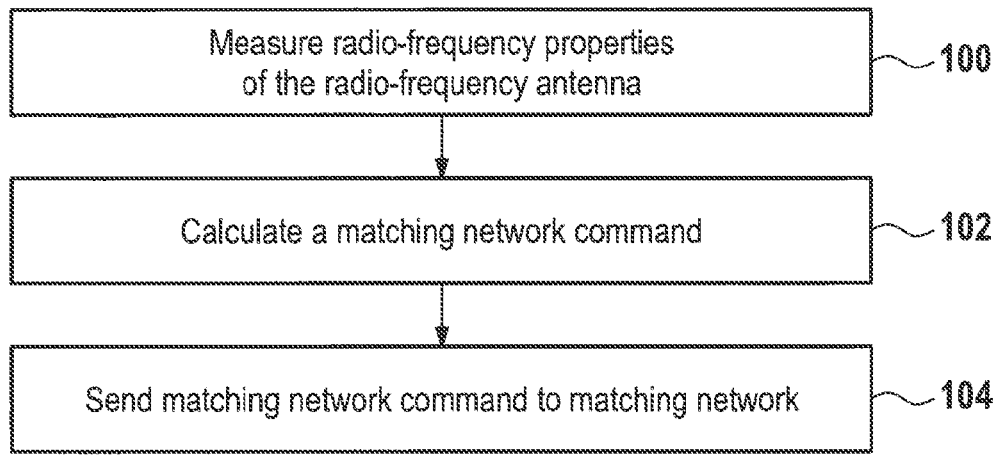
FIG. 1 shows a flow diagram which illustrates a method according to an embodiment of the invention.

FIG. 1 shows a flow diagram which illustrates a method according to an embodiment of the invention. In step 100 a set of radio-frequency properties of the radio-frequency antenna are measured using at least the radio-frequency transmitter. Next in step 102 a matching network command is calculated using the set of radio-frequency properties and a radio-frequency model. Finally in step 104 the matching network command is sent to the matching network. The matching network command then causes the impedance matching network to be adjusted.

Figure 2:
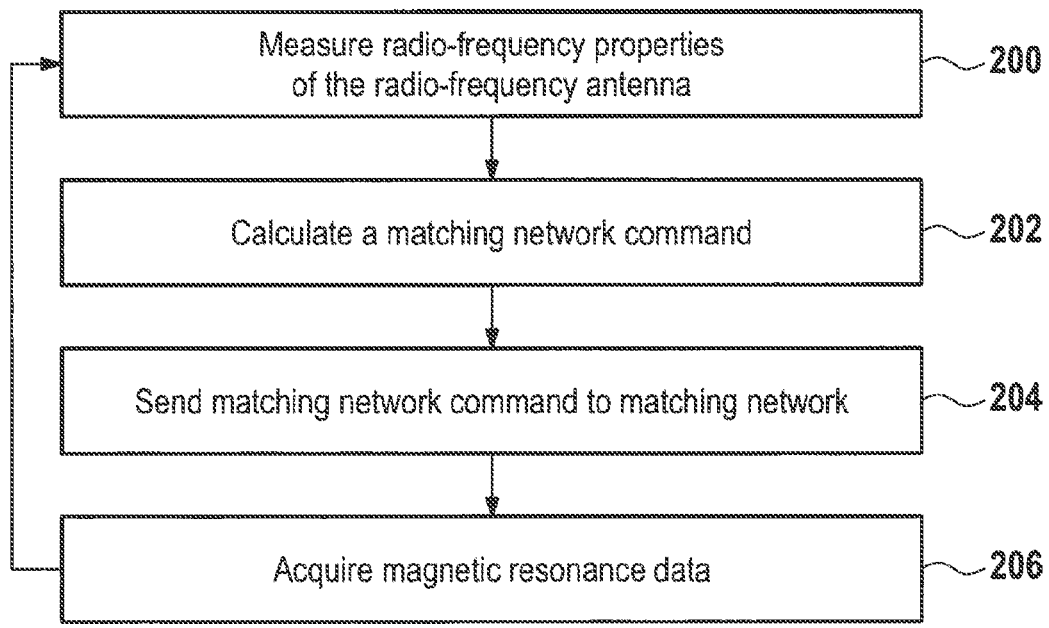
FIG. 2 shows a flow diagram which illustrates a method according to a further embodiment of the invention.

FIG. 2 shows a flow diagram which illustrates a method according to a further embodiment of the invention. First in step 200 a set of radio-frequency properties of the radio-frequency antenna are measured using at least the radio-frequency transmitter. Next in step 202 a matching network command is calculated using the set of radio-frequency properties and a radio-frequency model. Next in step 204 the matching network command is sent to the impedance matching network. This causes the impedance matching network to be adjusted. Finally in step 206 magnetic resonance data is acquired using the magnetic resonance imaging system. For instance the processor may generate commands which cause the magnetic resonance imaging system to acquire the magnetic resonance data. In FIG. 2 this method is optionally iterative. After the magnetic resonance data has been acquired the method may repeat itself by going to step 200.

Figure 3:
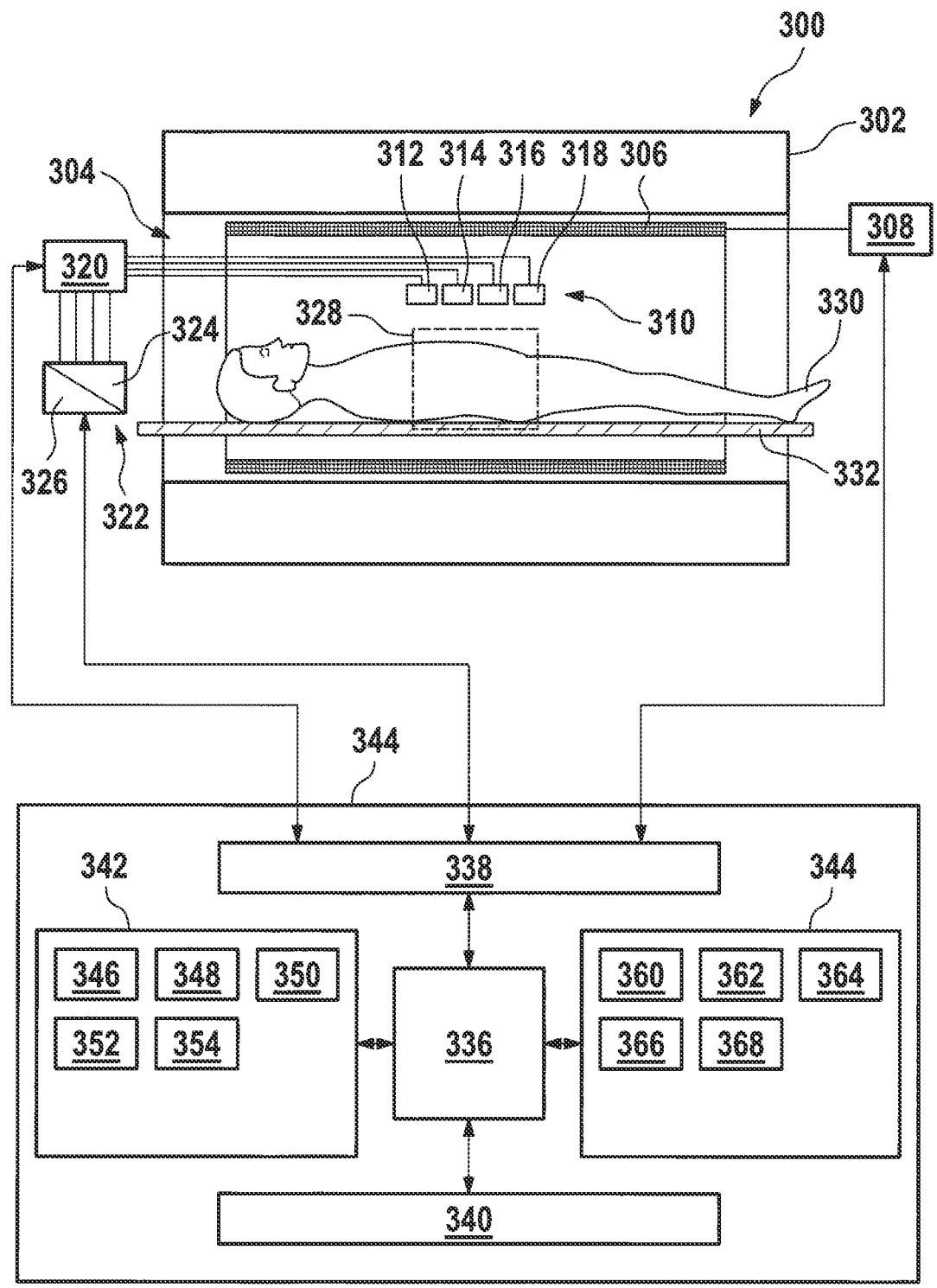
FIG. 3 shows a magnetic resonance imaging system 300 according to an embodiment of the invention

FIG. 3 shows a magnetic resonance imaging system 300 according to an embodiment of the invention. The magnetic resonance imaging system 300 comprises a magnet 302. The magnet 302 is a cylindrical type superconducting magnet with a bore 304 through the center of it. The magnet 302 has a liquid helium cooled cryostat with superconducting coils. It is also possible to use permanent or resistive magnets. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 304 of the cylindrical magnet 302 there is an imaging zone 328 where the magnetic field is strong and uniform enough to perform magnetic resonance imaging.

Within the bore 304 of the magnet 302 there is also a set of magnetic field gradient coils 306 which are used for acquisition of magnetic resonance data to spatially encode magnetic spins within an imaging zone of the magnet. The magnetic field gradient coil is connected to a magnetic field gradient coil power supply 308. The magnetic field gradient coils 306 are intended to be representative. Typically magnetic field gradient coils contain three separate sets of coils for spatially encoding in three orthogonal spatial directions. A magnetic field gradient power supply supplies current to the magnetic field gradient coils. The current supplied to the magnetic field coils is controlled as a function of time and may be ramped or pulsed.

Adjacent to the imaging zone 328 is a radio-frequency antenna 310. In this example the radio-frequency antenna 310 comprises a first antenna element 312, a second antenna element 314, a third antenna element 316, and a fourth antenna element 318. The antenna elements 312, 314, 316, 318 are all connected to an impedance matching network 320. The impedance matching network 320 is connected to transceiver 322. The transceiver 322 comprises a transmitter 324 and a receiver 326. In alternative embodiments the matching network is connected to only the transmitter 324. The receiver 326 may also be connected to a separate receive coil. A subject 330 is reposing on a subject support 332 and is partially within the imaging zone 328. When the subject 330 is within the imaging zone 328 the subject 330 affects the impedance of the antenna elements 312, 314, 316 and 318.

The matching network 320, the transceiver 322, and the magnetic field gradient coil power supply 308 are all connected to a hardware interface 338 of computer 334. The computer further comprises a processor 336 which is connected to the hardware interface 338 as well as a user interface 340, computer storage 342, and computer memory 344. The hardware interface 338, the processor 336 is able to send and receive data to the various components and control the magnetic resonance imaging system 300.

Within the computer storage 342 is stored magnetic resonance data 346. The magnetic resonance data 346 was acquired using the magnetic resonance imaging system 300. The computer storage 342 is further shown as containing a magnetic resonance image 348 reconstructed from the magnetic resonance data 346. The computer storage 342 is further shown as containing a pulse sequence 350. A pulse sequence as used herein encompasses a set of commands for a magnetic resonance imaging system 300 which enables it to acquire the magnetic resonance data 346. The pulse sequence may be stored as a timeline descriptive of sequential commands or it may be stored in a machine executable form. Pulse sequences 350 may be displayed on a user interface 340 in the form of a timeline.

The computer storage 342 is further shown as containing a set of radio-frequency properties 352 that have been measured. The radio-frequency properties 352 may for instance be an s-matrix or other measurements which have been acquired using radio-frequency sensors. Radio-frequency sensors are not illustrated in this diagram. The simultaneous use of the transmitter 324 and the receiver 326 with appropriate software may enable the processor 336 to use the transceiver 322 to measure an s-matrix. The computer storage 342 is further shown as containing a matching network command 354. The matching network command 354 is a command or set of commands which the processor 336 may send to the impedance matching network 320 to adjust the impedance matching of the antenna elements 312, 314, 316 and 318.

The computer memory 344 is shown as containing a control module 360. The control module 360 contains computer executable code which enables the processor 336 to control the operation and function of the magnetic resonance imaging system 300. The computer memory 344 is further shown as containing an image reconstruction module 362. The image reconstruction module 362 contains computer executable code which enables the reconstruction of magnetic resonance data 346 into a magnetic resonance image 348. The computer memory 344 further contains a radio-frequency measurement module 364. The radio-frequency measurement module 364 contains computer executable code which enables the processor 336 to use components of the magnetic resonance imaging system 300 to measure the set of radio-frequency properties 352. The computer memory 346 is further shown as containing a radio-frequency model 366. The radio-frequency model 366 is a model which uses the radio-frequency properties 352 as input and enables accurate radio-frequency modeling of the impedance matching network 320 and/or the radio-frequency antenna 310. The computer memory 344 is shown as further containing a matching network command generation module 368. The matching network command generation module 368 uses the radio-frequency model 366 and the measured set of radio-frequency properties 352 to generate the matching network command 354.

In Magnetic Resonance Imaging there is a clear trend to array designs for the Radio-Frequency (RF) transmission and reception. Today, the clinical application of multi channel transmission is the RF-shimming at 3 Tesla since wave propagation effects generate too much B1 field inhomogeneity in many patients. RF shimming enables clinical investigation with even with wave propagation effects present in the volume of interest. Basic idea of RF-shimming is to superimpose various transmit fields with different shapes, phases and amplitudes such, that the resulting transmit field amplitude becomes homogeneous inside a desired FOV. Those transmit fields are typically generated by a transmit coil array. One of the challenges in the development of such a transmit coil array is to increase the power efficiency of such a coil.

In particular two efficiency values are of interest:

$$sp_{max} = \frac{B1}{\sqrt{P_{n,max}}}$$

$$= \frac{B1}{\sqrt{\max(P_n)}}$$

$$sp_{sum} = \frac{B1}{\sqrt{P_{total}}}$$

$$= \frac{B1}{\sqrt{\sum_{n=1\ldots N} P_n}}$$

B1: the RF magnetic field at reference point(s) required for spin excitation
$P_n$: the peak power applied via channel n
$P_{n,max}$: is the maximum power on a single channel
$P_{n,max}=\max(P_n, n=1 \ldots N)$
N: the number of channels available
sp: the corresponding efficiency values
It is beneficial to design for a high value of $sp_{sum}$, but also $sp_{max}$ is important. The maximum power does not always occur at the same channel for different patient and FOV, so that all RF amplifiers have to be designed for $P_{n,max}$. In case of a big deviation of the power values used, this leads to an inefficient use of the installed RF power. Both values can be already considered in the RF-shimming calculation, by regularization it is possible to find a reasonable trade off between homogeneity achieved, the total and the maximum power.

However, there are remaining imperfections of the coil which should be addressed as follows. There are two reasons for the inefficiency of an array:
  Power is reflected at the ports of the coil since the coil elements are not properly matched to the impedance of the feeding system (e.g. 50 Ohm)
  Power is coupled from one element of the array to the others and leaves the array elsewhere This lost power has two disadvantages: Firstly, it has to be generated so that multi channel systems often require more powerful RF-amplifiers (more total RF-power). Secondly, this power propagates in the wrong direction, it can also disturb the operation of the RF-amplifiers. Therefore, expensive isolators (each one build from a circulator and dummy load) have to be used to protect the amplifiers.

Normally, tuning, decoupling and matching of the transmit coil array is optimized for a fixed geometry and an assumed typical loading like an average weight patient in abdominal imaging. Different loading or changes of the coil geometry (flexible arrays) have impact on the efficiency of such a coil.

Furthermore, reflection and coupling can superimpose, so that the power efficiency of such an array also depends on the relative amplitudes an phases applied. More in detail, a coil array with strong mismatch and strong coupling can be very efficient in at least a special feeding situation as long as a magnitudes and phases applied lead to a cancellation of the sum signals (reflected and coupled signals) leaving the coil.

Embodiments of the invention may provide for a method and corresponding hardware to adjust matching/tuning/decoupling of the coil array so that the power is efficiently used.

Let the wave amplitude vector ("shim setting" resulting from the RF shimming calculation) be described with a complex vector a. with N components (number of channels/coil elements).

The unit of a is the square root of Watt and $a^H a$ describes the transmit power, which is to be generated by the amplifiers ($a^H$ means the complex conjugate transpose of a). The reflection and transmission of the coil is described by the so called scattering matrix S: The signals leaving the coil are than characterized by a wave vector b=Sa and the lost power is given by $b^H b = a^H S^H S a$. Today, the RF-coil is made such that all the entries in S are as small as possible so that the reflected/transmitted power $b^H b$ becomes low. However, a perfect matching and decoupling is not possible and also depends on the individual patient. With this invention, we use variable matching of each individual coil channel to reduce the relative power loss $(b^H b)/(a^H) = \_ (a^H S^H S a)/(a^H a)$. The basic feature is a variable matching network for each individual channel. With such a set of matching networks, it can be shown to be possible to match always such that there is no power reflected/transmitted at all. Such a matching network transforms the coil scattering matrix S to a new matrix $S_t$ as well as the feeding vector a is to be transformed to a new vector $a_t$. It is worth mentioning that this method is independent from the pattern to be excited. Finding a compromise between achievable homogeneity and power efficiency is not required. However finding such a compromise is not excluded.

Methods for tuning the matching network are discussed next. The matching has to be performed such that the transformed wave amplitude vector $a_t$ is an eigenvector to the eigenvalue 0 of the (singular) matrix $S_t^H S_t$. A scalar, i.e., one channel, general lossless reciprocal matching network has three degrees of freedom. However, a phase shift along the matching network does not change the power levels, therefore there are only two relevant parameters. These can be characterized by the complex reflection coefficient at the output side of the matching network (which is to be connected to the coil input). By choosing these by $r_n = (b_n/a_n)^H$ the reflection at the input sides of the matching vanishes. This reduces both, single and overall power level.

FIGS. 4-7 show this effect for four volunteers in a the current MBC60 (8-channel Body coil multi-transmit system). The coil was initially tuned and matched for volunteer D (cf. FIG. 7), yielding a low effect for that loading. However, for other volunteers, all single power levels could be reduced and the overall power was decreased up to 20% (HWC). In the figures the relative forward powers are plotted. Due to matching, there is no reflected power in the ideal matched case and the forward power was decreased.

The figures were calculated for optimized abdominal shim settings, however, the effect is very similar also in the HWC. (HWC means "Hardware Compatibility Mode" and is related to a constant amplitude and constant phase difference in neighbouring channels.)

Figure 4:
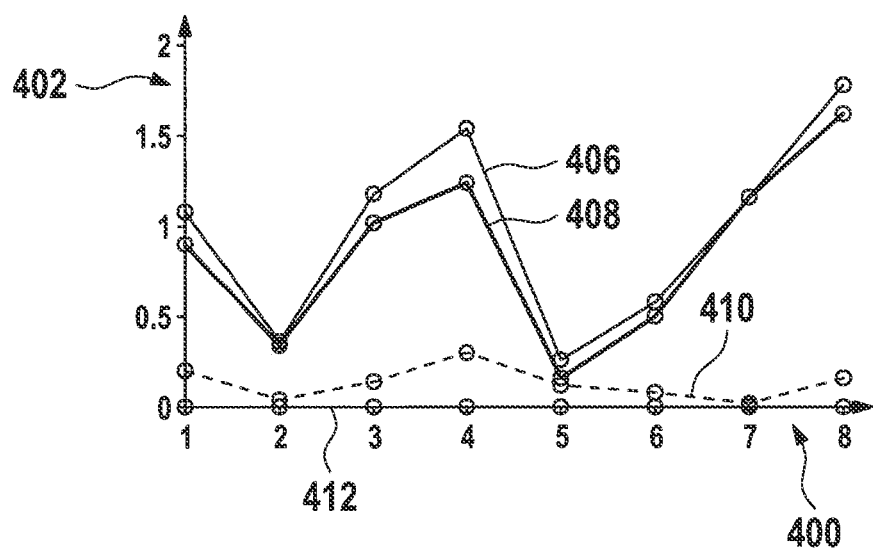
FIG. 4 shows a plot with calculated power levels at the radio-frequency antenna and the matching network for a first volunteer.

FIG. 4 shows power levels at the radio-frequency antenna and the matching network for volunteer A. The x-axis labeled 400 shows eight different channels. The y-axis 402 shows either the forward or reflected power. The curve labeled 406 is the forward power at the radio-frequency antenna. The curve labeled 408 is the forward power at the antenna using the method of matching the matching network. The curve labeled 410 shows the reflected power at the matching network. The curve labeled 412 shows the reflected power at the matching network applying a method according to an embodiment of the invention. It can be seen in this Fig. that the reflected power decreased by appropriate 12.8%.

Figure 5:
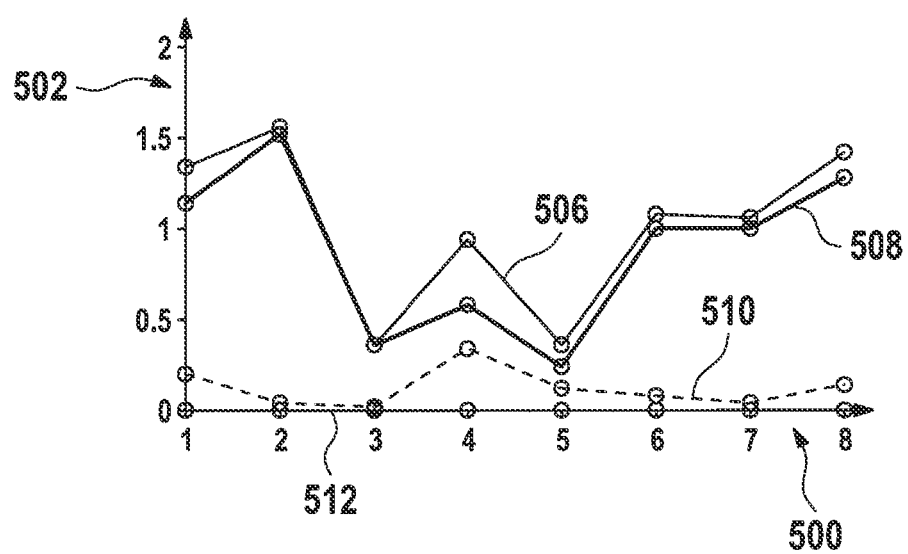
FIG. 5 shows a plot with calculated power levels at the radio-frequency antenna and the matching network for a second volunteer.

FIG. 5 shows the forward and reflected power for a second volunteer B. The x-axis 500 again shows the eight channels and the y-axis 502 shows the forward and reflected power. The curve labeled 506 is the forward power at the antenna. The curve labeled 508 is the forward power of the antenna applying a method according to an embodiment of the invention. The curve labeled 510 shows the reflected power at the matching network. The curve labeled 512 shows the reflected power at the matching network applying a method according to an embodiment of the invention.

Figure 6:
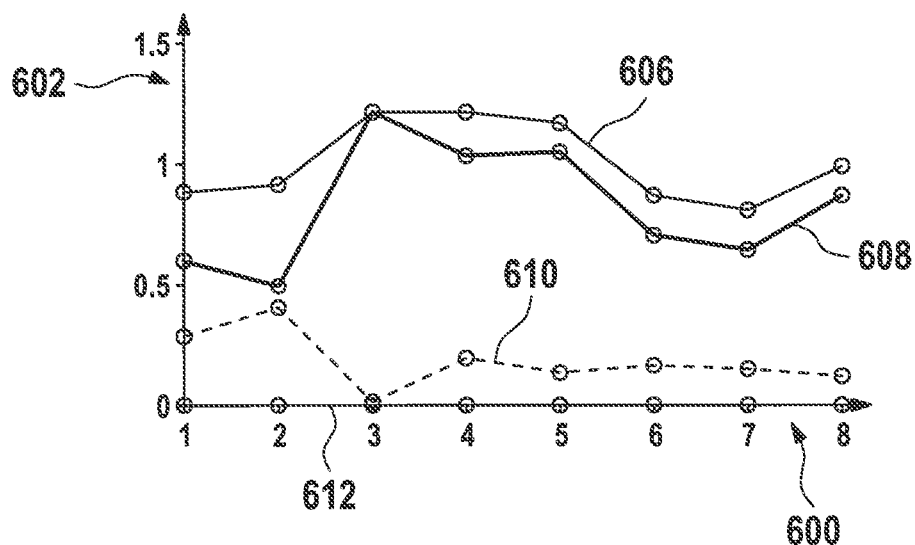
FIG. 6 shows a plot with calculated power levels at the radio-frequency antenna and the matching network for a third volunteer.

FIG. 6 shows the power levels for a third volunteer, volunteer C. The x-axis is labeled 600 and again shows the forward reflected power 602 for eight different channels. The curve labeled 606 shows the forward power at the antenna 506. Curve 508 shows the forward power at the antenna applying a method according to an embodiment of the invention. The curve labeled 610 shows the reflected power at the matching network. The curve labeled 612 shows the reflected power at the matching network applying a method according to an embodiment of the invention. It can be seen in this Fig. that the reflected power decreased by appropriate 17.9%.

Figure 7:
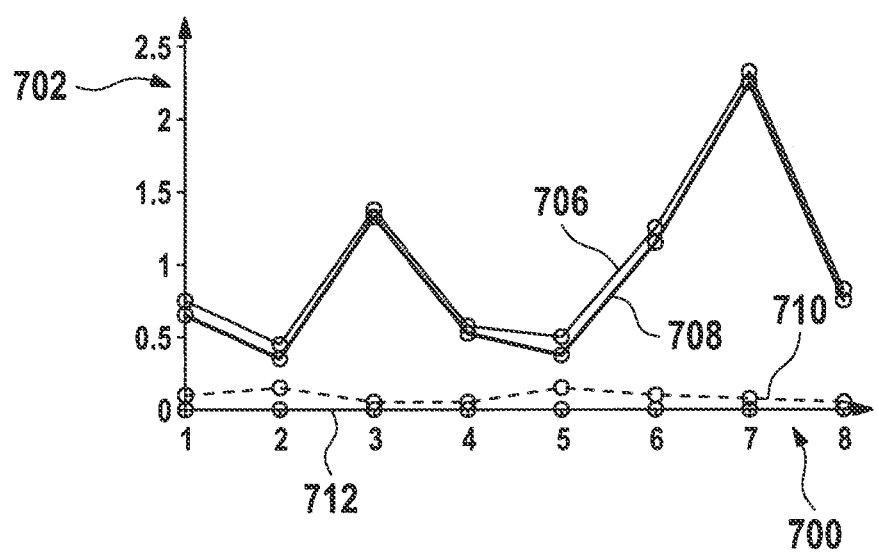
FIG. 7 shows a plot with calculated power levels at the radio-frequency antenna and the matching network for a fourth volunteer.

FIG. 7 shows the power levels for a fourth volunteer, volunteer D. Again the x-axis 700 shows the forward and reflected power 702 for eight different channels. The curve labeled 706 is the forward power of the antenna. The curve labeled 708 is the forward power of the antenna applying a method according to an embodiment of the invention. The curve labeled 710 shows the reflected power at the matching network. The curve labeled 712 shows the reflected power of the matching network using a method of matching according to an embodiment of the invention. In this case, the power levels for the reflected power decrease by approximately 8.3%.

Figure 8:
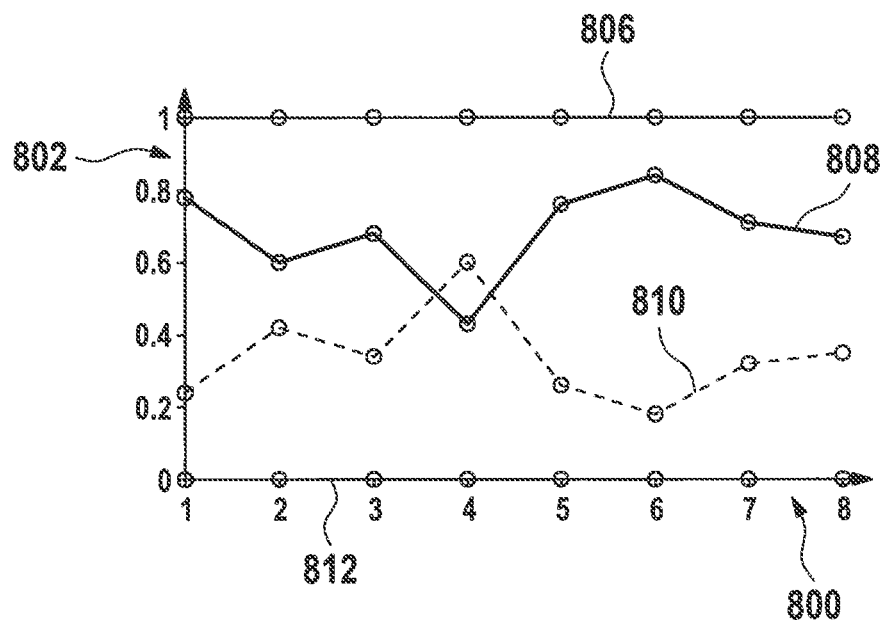
FIG. 8 shows a plot with calculated power levels at the radio-frequency antenna and the matching network for an empty coil.

FIG. 8 shows a simulation of the same system used with the simulation shown in FIGS. 4-7 but in this case therefore an empty coil. The x-axis 800 shows the power level 802 for each of the eight channels. The curve 806 shows the forward power at the antenna. The curve 808 shows the forward power of the antenna applying a method of matching according to an embodiment of the invention. The curve 810 shows the reflected power of the matching network. The curve 812 shows the reflected power of the matching network applying a method of matching according to the embodiment of the invention. In this case the reflected power decreased by appropriate 32.8%.

As FIGS. 4 to 7 illustrate, the reflected power may be reduced but the remaining power levels are still varying. This cannot be solved by the adopted matching alone.

However, some embodiments of the invention may provide for a tuneable controlled coupling/decoupling network (one parameter per element). Assuming only one more free parameter per element for controlled coupling, we can adjust the coil such, that the power is equally distributed along the coil elements. This is illustrated in FIGS. 9 and 10.

Figure 9:
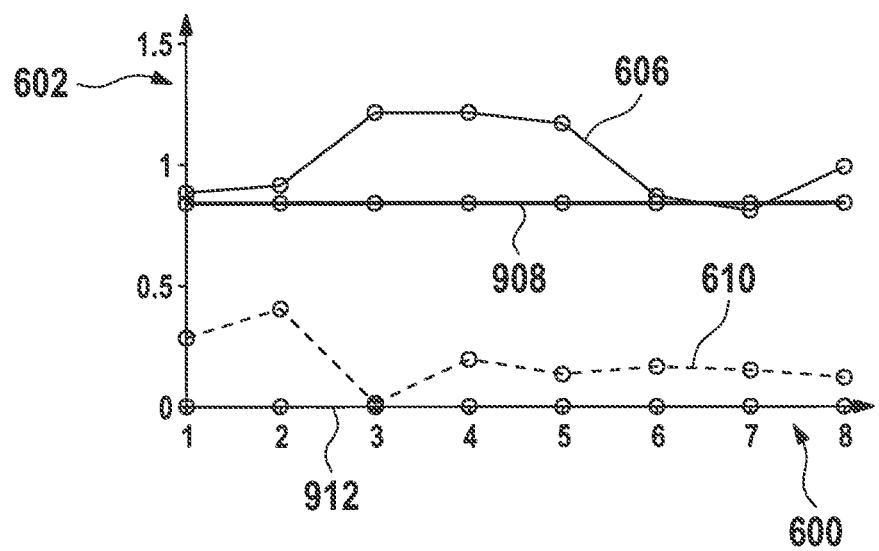
FIG. 9 shows the data plotted FIG. 6 to illustrate the benefit of a tunable controlled coupling/decoupling network between coil elements.

FIG. 9 illustrates the benefit of having a tunable controlled coupling/decoupling network between coil elements. FIG. 9 shows the data for volunteer C as was shown in FIG. 6 again. In this case both decoupling between the various channels and matching was applied. Curve 908 shows the forward power at the antenna applying decoupling and matching according to an embodiment of the invention. Curve 912 shows the reflected power at the matching network using decoupling and matching according to an embodiment of the invention. In this case it can be seen that curve 908 has a constant forward power as opposed to the curve 608 in FIG. 6. This illustrates the benefit of coupling pairs of the multiple antenna elements in the impedance matching network.

Figure 10:
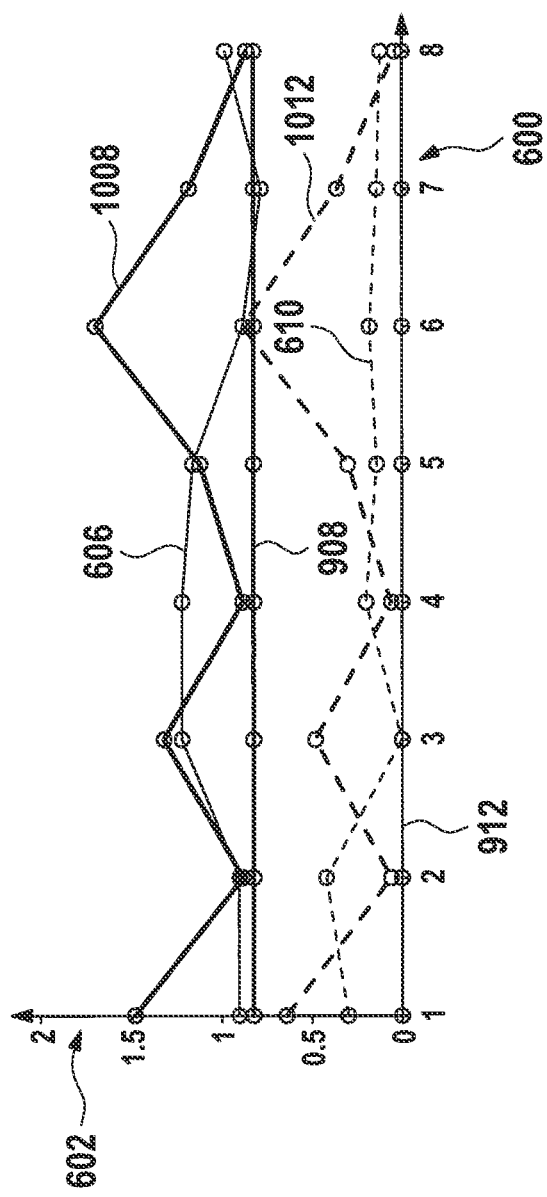
FIG. 10 shows the same data as FIG. 9 with the addition of the forward power at the antenna with only decoupling and without adjusting the matching network.

FIG. 10 shows the same data as FIG. 9 except that in this Fig. the forward power at the antenna is shown only with decoupling before matching. Curve 1012 shows the reflected power of the matching network using only decoupling and not applying matching according to an embodiment of the invention. FIG. 10 illustrates the benefit of performing both the decoupling and adjustable matching.

With the insight as described above, it is possible to reduce the nominal power required, and to even omit circulators in the RF chain. However, tuning, matching and decoupling components of the transmit coil have to adjustable. This can be achieved by several different means.

First, varactor diodes may be used to adjust the impedance matching to the transmit coil. For these components the capacitance can be adjusted in the desired range by adjusting the bias voltage. In opposite to the reception case where additional noise from the diodes ohmic resistance is undesired, added losses in the transmit case are negligible (at least compared to the gain which can be achieved). Normally the usage of varactor diodes is limited due to the high peak power required, but with increasing channel number the pear power per channel reduces (with it currents and voltages through the actuator).

Mechanically tuneable devices may also be used to adjust the impedance matching to the transmit coil. The impedance of capacitors and inductances can be changed mechanically. Tunable cylinder capacitors or inductances with adjustable (non)magnetic cores are widely known. As drive mechanisms can be e.g. used:
  Linear or radial motors directly at the component to be tuned or connected via Bowden cables over longer distances
  Bimetal actuators
  Optically variable capacitors OVC
  Piezo actuators
  Hydrodynamic actuators
  Adjusting by using the B0 field to generate a torque to at least a second electromagnet.

Figure 11:
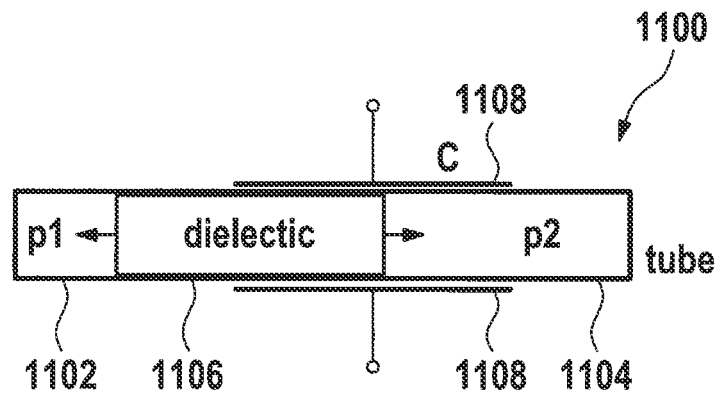
FIG. 11 illustrates an example of a hydrodynamically tuned capacitor.
Figure 12:
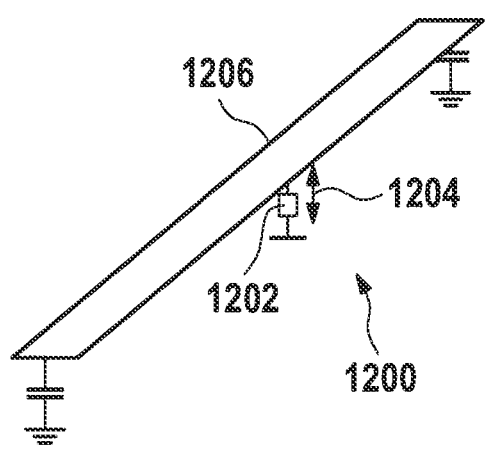
FIG. 12 illustrates an example of direct tuning of a frequency coil.

FIG. 11 shows an example of a hydrodynamically tuned capacitor to be used for adjusting a matching network according to an embodiment of the invention. The capacitor 1100 has a first chamber 1102 and a second chamber 1104. By adjusting the relative pressure in the two chambers 1102, 1104 a dielectric 1106 is moved back and forth between two capacitor plates 1108. A tube is placed between the electrodes 1108 of the capacitor 1100. By adjusting the pressure p1 and p2 the dielectric can be moved in and out to adjust the capacitance C. Several variations may also be implemented:
  The dielectric can be metallic also changing the capacitance
  The method also works for (non)magnetic cores of inductances
  The tube can be closed on one side of p2, space of p2 can be filled with compressible gas. (then only p1 has to be adjusted)
  The tube can be open on side p2, resetting force (instead of compressible gas) can be realized with a spring Instead of modifying lumped elements as described above, modifications can directly be made on the RF coil. For example, FIG. 12 shows an example of direct tuning of a frequency coil 1200. In this example a piezo actuator 1202 moves in the direction indicated 1204. The movement of the piezo actuator 1202 causes the TEM element 1206 to move and thereby change the tuning of the element 1206.

As described above, tuning matching and decoupling of the coil can be directly modified within the coil itself or on its lumped components. However, it has been shown that tuning, matching and decoupling is also possible from remote. The references given below describe two methods to where the decoupling network is connected to the coil via n*lambda/4 cables. Furthermore, with the advent of amplifier integration into the coil, the actuators or a part of the active tuning can be subcomponents of the amplifier itself, e.g. output matching.

Measuring the S-matrix and the optimization can be done within seconds with hardware already present on the system. No MRI measurements, just like B1 mapping, are required.

Figure 13:
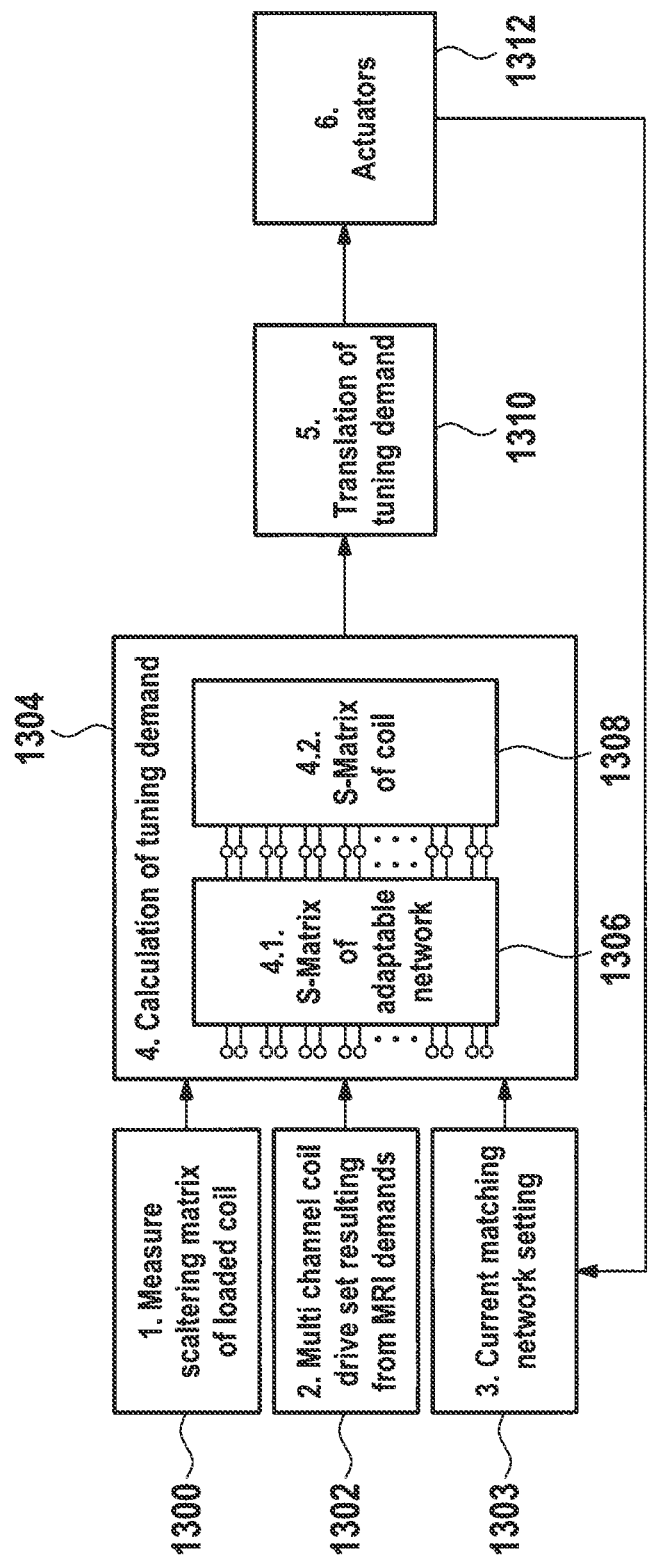
FIG. 13 shows a block diagram which illustrates the functioning of a software tool according to an embodiment of the invention.

FIG. 13 shows a block diagram which illustrates the functioning of a software tool for performing an embodiment of the invention. In step 1300 the scattering matrix of a loaded coil is measured. In step 1302 a multichannel coil drive set for MRI demands is determined. The drive set comprises the magnitude and phase of RF to be applied to the radio-frequency coil. In step number 3 the current matching network setting is determined. In step number 4 the adjustment in the tuning of the matching network is determined. 1306 represents a s-matrix or model of the s-matrix of the adaptable network such as the tuning network. The block labeled 1308 represents the s-matrix of the loaded coil. In step number 5 the tuning demand is translated into an actuator signal. Finally in step number 6 the actuators for the matching network receive their signal and are changed to a different position. The steps 1303, 1304, 1310, 1312 may be repeated in a loop. These steps can further be summarized as:

1. Measurement 1300 of the coils scattering matrix (S-matrix), this already known from other applications. The measurement consists of linearly independent multi-channel RF pulses which are send via the transmit chain and monitored by dedicated receive channels. A advanced version of this step considers not only the S-matrix itself but also the magnetic field B1 inside the coil. Recent measurements show that having properly adjusted S-parameters at the ports fed by the amplifier does not necessarily indicate efficient function of the system. To measure this, the S-matrix can be measured during, for instance, B1 mapping or FID sampling experiments while applying linearly independent drive sets 2. The demand drive set results 1302 from imaging requirements, can be considered as predefined 3. The status 1303 of the adaptable matching network has to be known, or to be set to a predefined state.

4. According to the input parameters 1304, and the known topology of the adaptable network the tuning demand, i.e. the amount of increase or decrease of a capacitor or an inductor is calculated.

5. The tuning demand 1310 is translated into actuator signal, e.g. the voltage required to reach a certain capacitance of a varactor diode is determined. Can be realized as a Look up table (LUT).

6. The actual actuators 1312 receive their tuning signal and change the network properties as required.

1 to 6 can be done prior to measurements or in parallel to an MRI experiment.

Figure 14:
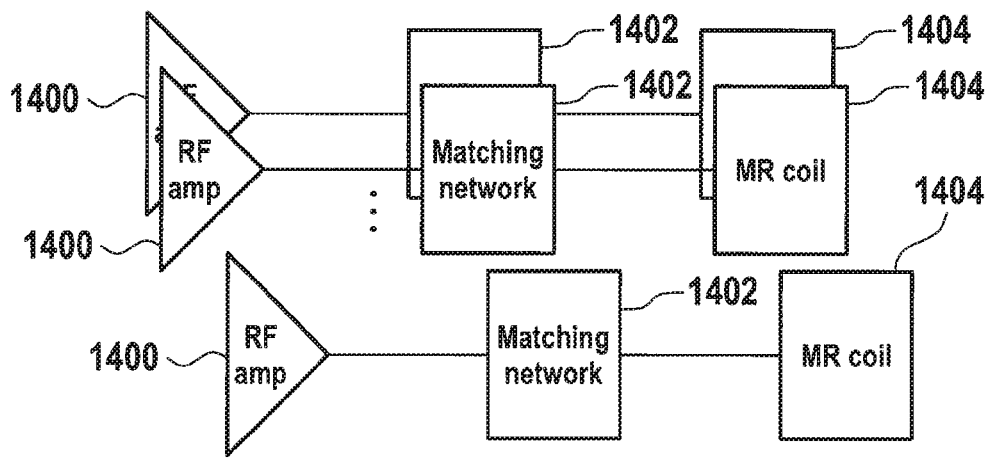
FIG. 14 shows an example of a radio-frequency system for a magnetic resonance imaging system according to an embodiment of the invention.

FIG. 14 shows an example of a radio-frequency system for a magnetic resonance imaging system according to an embodiment of the invention. There is shown a collection of radio-frequency transmitters 1400. Each radio-frequency transmitter 1400 is connected to a separate matching network 1402. Each matching network 1402 is connected to a separate radio-frequency coil element 1404. The adaptive matching networks 1402 are placed between amplifier 1400 and coil 1404. Each coil channel 1404 has its own matching network 1402. The networks act independently, though being centrally controlled.

Figure 15:
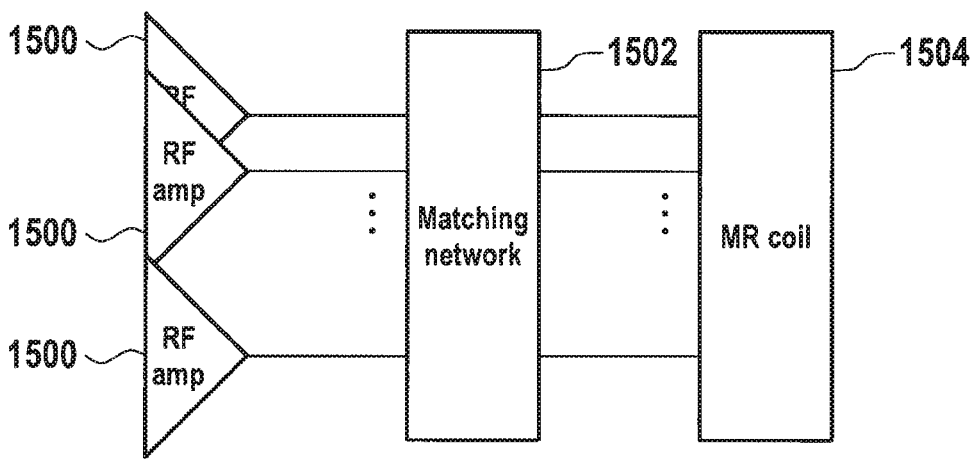
FIG. 15 shows an example of a radio-frequency system for a magnetic resonance imaging system according to a further embodiment of the invention.

FIG. 15 shows another radio-frequency system for a magnetic resonance imaging system according to an embodiment of the invention. In FIG. 15 there is a collection of radio-frequency transmitters 1500. Each radio-frequency transmitter 1500 is connected to a separate input of a multi-port matching network 1502. The matching network 1502 is connected via a collection of individual cables to a multi-element magnetic resonance antenna 1504. The individual RF amplifiers 1500 are connected to a common matching network 1502 here also interconnections to other channels within the network are possible.

Figure 16:
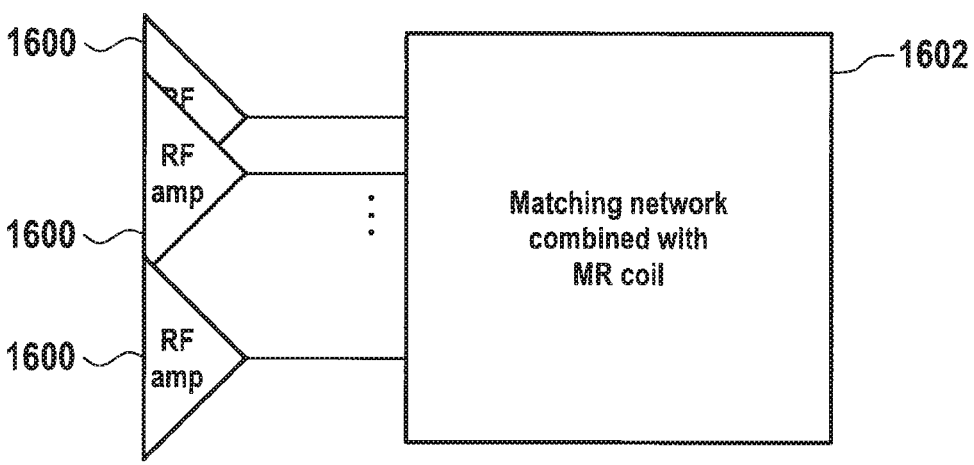
FIG. 16 shows an example of a radio-frequency system for a magnetic resonance imaging system according to a further embodiment of the invention.

FIG. 16 shows another radio-frequency system for a magnetic resonance imaging system according to an embodiment of the invention. In FIG. 16 there is a collection of radio-frequency transmitters 1600. The individual radio-frequency transmitters 1600 are connected to a combined matching network and multi-element magnetic resonance antenna 1602. Matching network and coil 1602 are joined cannot be distinguished. This version considered that it can be advantageous to adapt the coil itself instead of adding an additional (possibly lossy or resistive) component.

Figure 17:
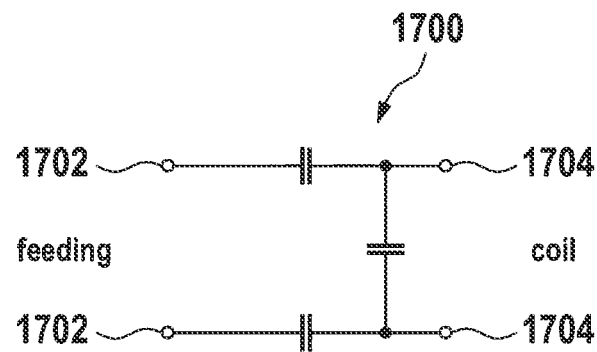
FIG. 17 shows an example of an l-matching network which may be used in an embodiment of the invention.

FIG. 17 shows an example of an L-matching network 1700 to be used as an embodiment of the invention. The matching network has inputs 702 and outputs 704.

Figure 18:
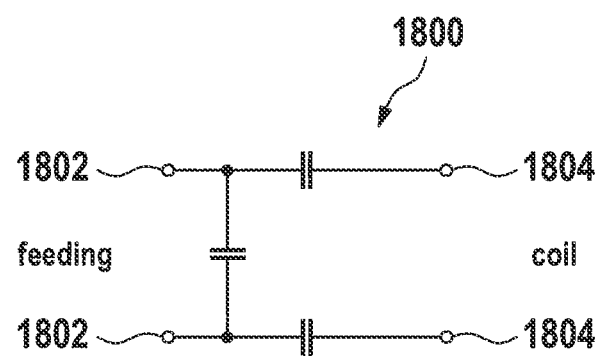
FIG. 18 shows a further example of an l-matching network which may be used in an embodiment of the invention.

FIG. 18 shows an alternative embodiment of an L-matching network 1800. The matching network 1800 has inputs 802 and outputs 804.

Figure 19:
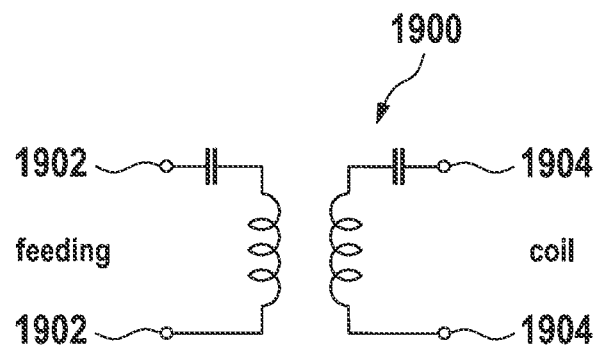
FIG. 19 shows an inductive matching network which may be used in an embodiment of the invention.

FIG. 19 shows a general (compensated) inductive matching network 1900. The matching network 1900 has inputs 1902 and outputs 1904. The matching network 900 may be used in an impedance matching network according to an embodiment of the invention.

Figure 20:
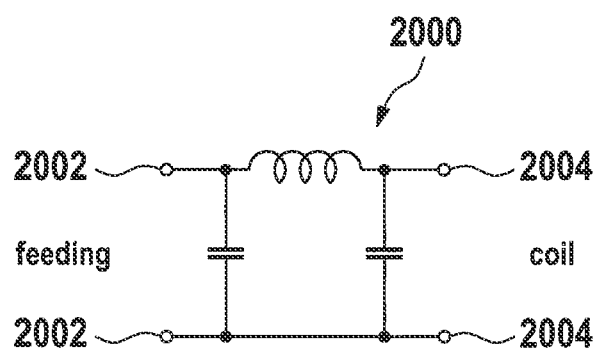
FIG. 20 shows a pi-matching network which may be used in an embodiment of the invention.

FIG. 20 shows a pi-matching network 2000 with three reactive elements according to an embodiment of the invention. The matching network 2000 may be used in an impedance matching network according to an embodiment of the invention. The matching network 2000 has inputs 2002 and outputs 2004.

Figure 21:
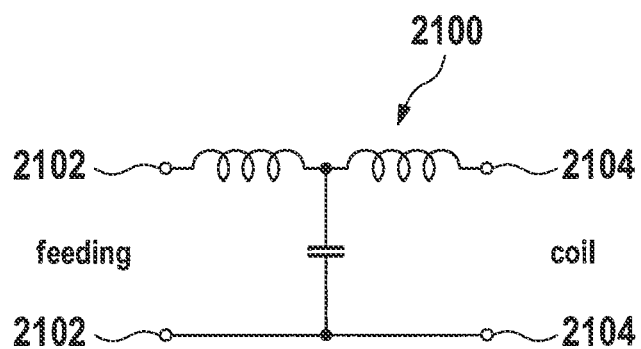
FIG. 21 shows a t-matching network which may be used in an embodiment of the invention.

FIG. 21 shows a T-matching network 2100 with three reactive elements. The matching network 2100 may be used in an embodiment according to an embodiment of the invention. The matching network 2100 has inputs 2102 and outputs 2104.

Figure 22:
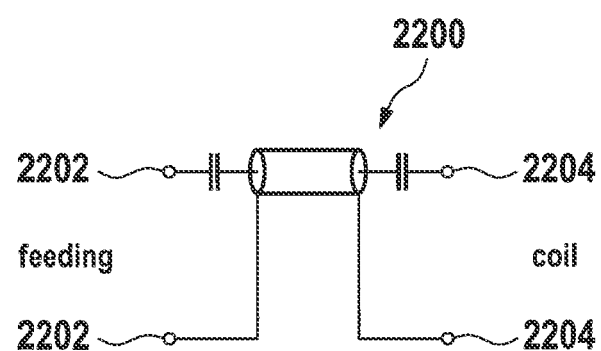
FIG. 22 shows a matching network which uses a transmission lines and which may be used in an embodiment of the invention.

FIG. 22 shows a matching network 2200 using a series of transmission lines typically a quarter wavelength long. The matching network 2200 has inputs 2202 and inputs 2204. The matching network 2200 may be used for building a matching network according to an embodiment of the invention and may be used for splitting components between two locations.

Figure 23:
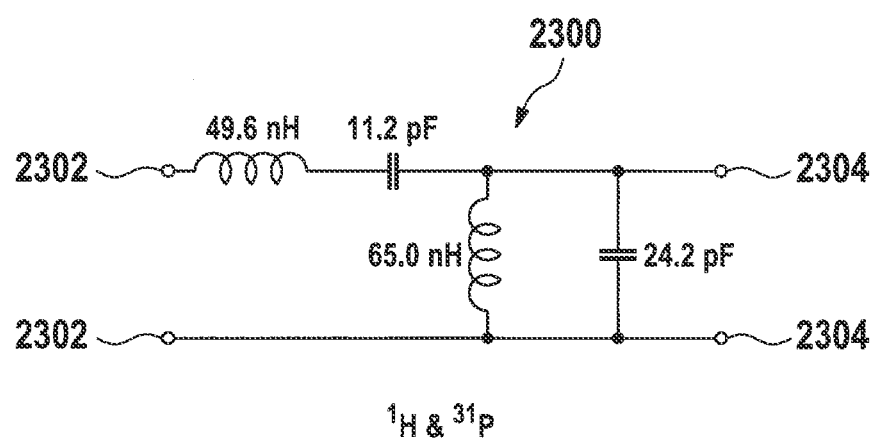
FIG. 23 shows a dual-frequency matching network that may be used for more than one frequency which may be used in an embodiment of the invention.

FIG. 23 shows a dual-frequency matching network that may be used for more than one frequency: for instance for hydrogen and phosphor. The matching network 2300 has an input 2302 and an output 2304.

In the matching networks shown in FIGS. 17-23 one or more inductors or capacitors are replaced with adjustable inductors or capacitors to make the respective matching networks adjustable so that a variety of impedances may be matched. FIGS. 24-27 show different examples of radio-frequency centers according to an embodiment of the invention.

Figure 24:
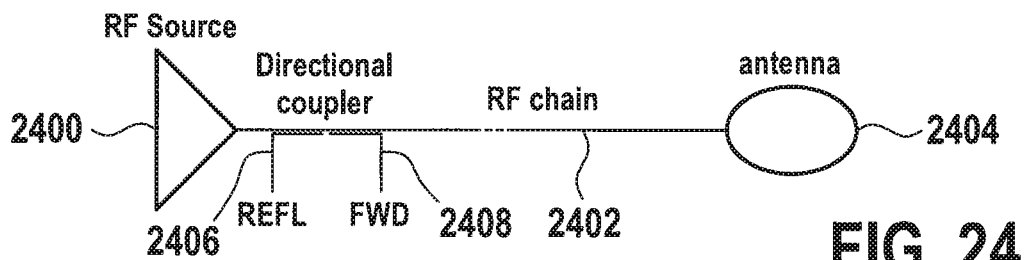
FIG. 24 illustrates a set of radio frequency sensors according to an embodiment of the invention.

In FIG. 24 a radio-frequency source 2400 is shown as being connected to an antenna 2404 through a radio-frequency chain 2402. The radio-frequency source 2400 may be a radio-frequency transmitter and/or radio-frequency generator. A radio-frequency chain is the components between a transmitter and the antenna 2404. This may include transmission lines, matching networks and other components. In FIG. 24 there is an example of a forward power directional coupler 2006 and a reflected power directional coupler 2408 mounted near the radio-frequency source 2400. These two directional couplers 2406 and 2408 are examples of radio-frequency sensors. The measurements may be placed on the output of all radio-frequency sources 2400.

The characterization of the RF properties of the antenna and matching network can be characterized in several different ways. The S-Matrix or scattering matrix can be measured.

Additionally the forward and reflected power are measured for linearly independent drive sets until the response matrix is fully known. This is realizable with a directional coupler and/or RF switches. If the chain attenuation and phase is known FWD and REFL power coupler do not need to be at the same position. From the S-Matrix well known impedance, admittance or ABCD matrices can be calculated.

Other hybrid type matrices may also be measured. Unlike typical definitions one can measure the forward power at the amplifier and the resulting currents in the antenna elements. There is also a linear relation between both. The relation can be written in matrix form. We call this matrix the "System Matrix", elements do not have to have the typical units of Ohm, Siemens or W (sqrt(W)).

The element currents can be measured using small loop antennae attached to the MRI antennae (such pick-up coils are known in MRI). Coupling between small loop and MRI antenna is week but of defined level. Furthermore measurement can be done using a coupler directly within the antenna (e.g. a voltage/current divider) to couple a small amount of the current/voltage to an AD converter.

Figure 25:
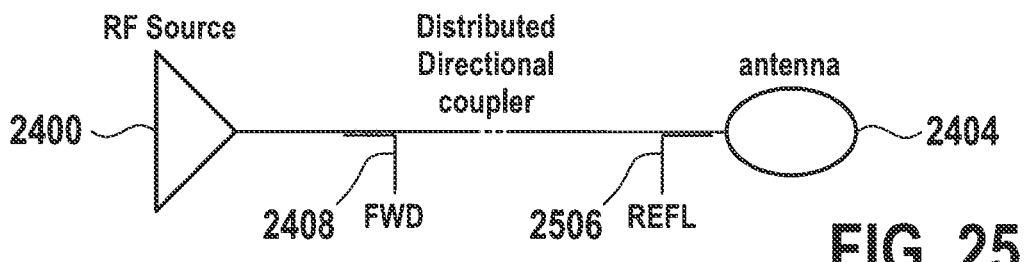
FIG. 25 illustrates a set of radio frequency sensors according to a further embodiment of the invention.

FIG. 25 shows an embodiment similar to that shown in FIG. 24. However in this embodiment the reflected power directional coupler is distributed. The reflected power directional coupler 2506 is mounted near the antenna 2404 instead of near the radio-frequency source 2400.

Figure 26:
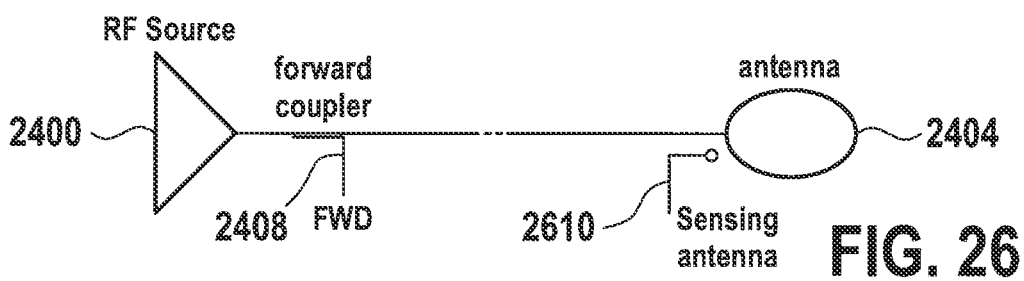
FIG. 26 illustrates a set of radio frequency sensors according to a further embodiment of the invention.

FIG. 26 shows an alternative set of radio-frequency sensors according to an embodiment of the invention. FIG. 26 is similar to FIG. 24. In this case the reflected power directional coupler 2406 has been replaced with an antenna 2610 near the antenna element 2404.

Figure 27:
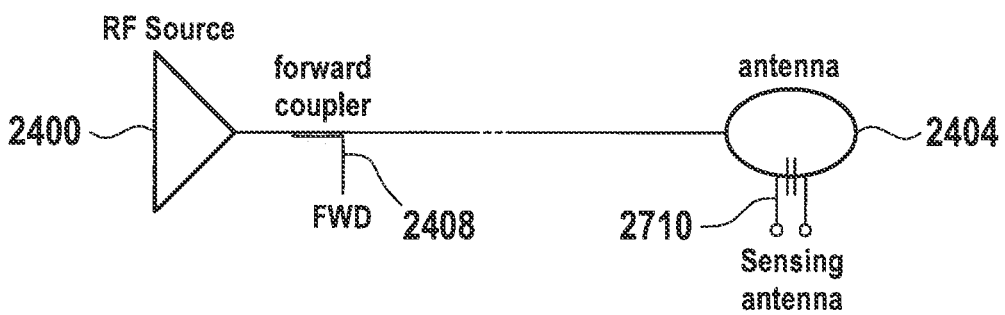
FIG. 27 illustrates a set of radio frequency sensors according to a further embodiment of the invention.

FIG. 27 shows an alternative set of radio-frequency sensors according to an embodiment of the invention. The embodiment shown in FIG. 27 is similar to that shown in FIG. 26. In this case the sensing antenna 2610 has been replaced with a molded measurement directly on the antenna 2710. For instance a capacitive voltage divider may be used to measure the voltage directly on the antenna. The various embodiments shown in FIGS. 24-27 may be combined to form a more comprehensive set of radio-frequency sensors. In addition the embodiments shown in FIGS. 24-27 may also be combined with the embodiment where the s-matrix is measured using the radio-frequency transmitter and receivers.

It should be noted that multiple element antennae tend to couple mutually. This coupling can be compensated using different methods in coil design, however residual coupling remains, e.g., due to the fact that coupling depends on the patient scanned.

This can be explained as follows:

The impedance matrix Z (calculated from, for example, the S-Matrix) looks like the following:

$$\begin{pmatrix} U1 \\ U2 \end{pmatrix} = \begin{pmatrix} Z11 & Z12 \\ Z21 & Z22 \end{pmatrix} \begin{pmatrix} I1 \\ I2 \end{pmatrix}$$

where U1 and U2 are the voltages, I1 and I2 are the currents at the feeding ports of the coil. (The impedance matrix is written for just two pots here for the sake of simplicity.) Without coupling, the S-matrix is diagonal. As can be shown the same is true for the corresponding Z-matrix. For case of cancelled coupling:

$$\begin{pmatrix} U1 \\ U2 \end{pmatrix} = \begin{pmatrix} Z11 & 0 \\ 0 & Z22 \end{pmatrix} \begin{pmatrix} I1 \\ I2 \end{pmatrix}$$

The input impedance is:

$$Zin = \frac{U1}{I1}$$
$$= Z11$$

and matching Zin to 50 ohm is possible without knowing signals at port 2.

In case of coupling present, Zin is $$Zin = \frac{U1}{I1}$$
$$= \left(Z11 - \frac{Z21 Z12}{Z22}\right) + \frac{U2 Z12}{I1 Z22}$$

Zin can only be brought to a target Z0 (e.g. 50) ohm if U2 is known. Also Zin changes with U2. The input impedances may be matched depending on the Z matrix (depending on the antenna and patient) and on the drive signals (depending on the imaging settings) at the other ports.

It is also possible to generalize the matching: having not only isolated matching networks at each port, but also having interconnections between the different matching networks.

This enables, e.g., to cancel the coupling.

However, coupling can also be changed in a favourable way, eg. To equalize the driving vector. It can happen that U1>>U2 or vice versa, the disadvantage is, that both transmitters have to be capable to provide the maximum signals, even if only one is usually used to the maximum. This can also be rephrased in terms of the incident power. This argument also applies when P1>>P2, where P1 is the power input on channel 1 and P2 is the power input on channel 2.

The input impedance depends on the patient and possibly the position of the patient. Changing the position of the patient may require to measure of the input impedance (or the S-matrix) again.

For different drive signals (here U) the Z-matrix of the coil is constant, there is no need to remeasure it.

Movement of the patient also changes the Z matrix. However in case of breathing the impact may be very small.

In some embodiments any adjustments to the matching network may be an iterative process, i.e. the matching can be adjusted and then the new excitation is tested with low power, reflected power is measured (should vanish in the optimal case) and the field is checked by field- and/or current probes (or MRI field measurements). An error function can be defined and the adjustment can be optimized by checking this error function.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 300 magnetic resonance imaging system
302 magnet
304 bore of magnet
306 magnetic field gradient coils
308 magnetic field gradient coil power supply
310 radio frequency antenna
312 first antenna element
314 second antenna element
316 third antenna element
318 fourth antenna element
320 matching network
322 transceiver
324 transmitter
326 receiver
328 imaging zone
330 subject
332 subject support 334 computer
336 processor
338 hardware interface
340 user interface
342 computer storage
344 computer memory
346 magnetic resonance data
348 magnetic resonance image
350 pulse sequence
352 radio-frequency properties
354 matching network command
360 control module
362 image reconstruction module
364 radio-frequency measurement module
366 radio-frequency model
368 matching network command generation module
400 channels
402 power
406 forward power at the antenna
408 forward power at the antenna (with matching)
410 reflected power at the matching network
412 reflected power at the matching network (with matching)
500 channels
502 power
506 forward power at the antenna
508 forward power at the antenna (with matching)
510 reflected power at the matching network
512 reflected power at the matching network (with matching)
600 channels
602 power
606 forward power at the antenna
608 forward power at the antenna (with matching)
610 reflected power at the matching network
612 reflected power at the matching network (with matching)
700 channels
702 power
706 forward power at the antenna
708 forward power at the antenna (with matching)
710 reflected power at the matching network
712 reflected power at the matching network (with matching)
800 channels
802 power
806 forward power at the antenna
808 forward power at the antenna (with matching)
810 reflected power at the matching network
812 reflected power at the matching network (with matching)
908 forward power at the antenna (with matching)
912 reflected power at the matching network (with decoupling and matching)
1008 forward power at the antenna (with only decoupling)
1012 reflected power at the matching network (with only decoupling)
1100 hydronamically tuned capacitor
1102 first chamber
1104 second chamber
1106 dielectric
1108 capacitor plates
1200 radio frequency coil
1202 piezo actuator
1204 direction of movement
1206 TEM element
1400 radio-frequency transmitter
1402 matching network
1404 radio-frequency coil element
1500 radio-frequency transmitter
1502 matching network
1504 multi-element magnetic resonance antenna
1600 radio-frequency transmitter
1602 combined matching network and multi-element magnetic resonance antenna
1700 matching network
1702 input
1704 output
1800 matching network
1802 input
1804 output
1900 matching network
1902 input
1904 output
2000 matching network
2002 input
2004 output
2100 matching network
2102 input
2104 output
2200 matching network
2202 input
2204 output
2300 matching network
2302 input
2304 output
2400 radio-frequency source
2402 radio-frequency chain
2404 antenna
2406 forward directional coupler
2408 reflected power directional coupler
2506 reflected power directional coupler
2610 loop antenna
2710 voltage measurement on antenna

The invention claimed is:

1. A magnetic resonance imaging system for acquiring magnetic resonance data, wherein the magnetic resonance imaging system comprises:

a radio-frequency transmitter for generating radio-frequency pulses during acquisition of the magnetic resonance data, wherein the radio-frequency transmitter has multiple transmit channels;

an impedance matching network adapted for impedance matching the radio-frequency transmitter to a radio-frequency antenna, wherein the radio-frequency antenna comprises multiple antenna elements, wherein the impedance matching network is adjustable remotely, the impedance matching network being circuited between the radio-frequency transmitter and the antenna elements and having a tunable controlled coupling/decoupling network between antenna elements;

a memory for storing machine executable instructions; and a processor for executing the machine executable instructions, wherein the processor is adapted for controlling the magnetic resonance imaging system, wherein execution of the instructions causes the processor to:

measure a set of radio-frequency properties of the radio-frequency antenna;

calculate a matching network command using the set of radio-frequency properties and a radio frequency model, wherein the radio frequency model is descriptive of the impedance matching network and the radio-frequency antenna; and adjust the impedance matching network including tuning the coupling/decoupling network between antenna elements by sending the matching network command to the impedance matching network.

2. The magnetic resonance imaging system of claim 1, wherein the magnetic resonance imaging system further comprises a radio-frequency receiver for acquiring the magnetic resonance data using the radio-frequency antenna, wherein the radio-frequency receiver has multiple receive channels; wherein the radio-frequency transmitter and the radio-frequency receiver are configured for simultaneous transmission on at least one of the multiple transmit channels and simultaneous reception on at least one of the multiple receive channels, and wherein the set of radio-frequency properties comprise in particular an S-Matrix measured using the at least one of the multiple transmit channels and using the at least one of the multiple receive channels.

3. The magnetic resonance imaging system of claim 1, wherein the radio-frequency properties are at least partially measured using the radio-frequency transmitter.

4. The magnetic resonance imaging system of claim 1, wherein the magnetic resonance imaging system further comprises a radio-frequency generator, wherein the radio-frequency properties are at least partially measured using the radio-frequency generator.

5. The magnetic resonance imaging system of claim 3, wherein the magnetic resonance imaging system comprises a set of radio-frequency sensors, wherein the radio-frequency properties are measured at least using the set of radio-frequency sensors.

6. The magnetic resonance imaging system of claim 1, wherein execution of the instructions causes the processor to acquire a magnetic field map using the magnetic resonance imaging system, wherein the radio-frequency properties are at least partially measured using the magnetic field map.

7. The magnetic resonance imaging system of claim 1, wherein execution of the instructions further causes the processor to acquire the magnetic resonance data using the magnetic resonance imaging system, wherein the magnetic resonance data is acquired after the impedance matching network has been adjusted.

8. A magnetic resonance imaging system for acquiring magnetic resonance data, wherein the magnetic resonance imaging system comprises:
a radio-frequency transmitter with multiple transmit channels configured to generate radio-frequency pulses during acquisition of the magnetic resonance data;
a radio frequency antenna with multiple antenna elements;
a remotely adjustable impedance matching network configured to impedance match the radio-frequency transmitter to the radio-frequency antenna, the impedance matching network being circuited between the radio-frequency transmitter and the antenna elements and including a tunable controlled coupling/decoupling network disposed between antenna elements;
a memory configured to store machine executable instructions; and
a processor configured to execute machine executable instructions wherein execution of the instructions causes the processor to:
measure a set of radio-frequency properties of the radio-frequency antenna;

determine B1 shim setting for the radio-frequency transmitter using the magnetic resonance imaging system;
calculate a power loss using the set of radio-frequency properties and the B1 shim settings;
choose a matching network adjustment;
transform the set of radio-frequency properties and the B1 shim setting using a radio-frequency model and the matching network adjustment, the radio frequency model being descriptive of the impedance matching network and the radio-frequency antenna;
adjust the impedance matching network including tuning the coupling/decoupling network between antenna elements by sending the matching network command to the impedance matching network;
calculate a changed power loss using the transformed set of radio-frequency properties and the transformed B1 shim setting; and
wherein the matching network command is calculated in accordance with the impedance matching network adjustment if the changed power loss is smaller than the power loss.

9. The magnetic resonance imaging system of claim 8, wherein execution of the instructions further causes the processor to iteratively repeat the choosing of the matching network adjustment and calculation of the changed power loss.

10. The magnetic resonance imaging system of claim 8, wherein the impedance matching network is configured to couple at least one pair of the multiple antenna elements, and wherein the coupling between the at least one pair of the multiple antenna elements is remotely adjustable.

11. The magnetic resonance imaging system of claim 10, wherein the step of calculating the matching network command comprises instructions for adjusting the coupling between the at least one pair of the multiple antenna elements.

12. A non-transitory computer program product comprising machine executable instructions, wherein the machine executable instructions are for execution by a processor controlling a magnetic resonance imaging system for acquiring magnetic resonance data, wherein the magnetic resonance imaging system comprises a radio-frequency transmitter for generating radio-frequency pulses during acquisition of the magnetic resonance data, wherein the radio-frequency transmitter has multiple transmit channels, wherein the magnetic resonance imaging system further comprises an impedance matching network adapted for impedance matching the radio-frequency transmitter to a radio-frequency antenna, wherein the radio-frequency antenna comprises multiple antenna elements, wherein the impedance matching network is adjustable remotely, the impedance matching network being circuited between the radio-frequency transmitter and the antenna elements and having a tunable controlled coupling/decoupling network between antenna elements, wherein execution of the instructions causes the processor to:
measure a set of radio-frequency properties of the radio-frequency antenna;
calculate a matching network command using the set of radio-frequency properties and a radio frequency model, wherein the radio frequency model is descriptive of the impedance matching network and the radio-frequency antenna; and
adjust the impedance matching network, including tuning the coupling/decoupling network between antenna elements, by sending the matching network command to the impedance matching network.

13. The non-transitory computer program product of claim 12, wherein execution of the instructions further causes the processor to:
determine a B1 shim setting for the radio-frequency transmitter using the magnetic resonance imaging system;
calculate a power loss using the set of radio-frequency properties and the B1 shim settings;
choose a matching network adjustment;
transform the set of radio-frequency properties and the B1 shim setting using the radio-frequency model and the matching network adjustment;
calculate a changed power loss using the transformed set of radio-frequency properties and the transformed B1 shim setting; and
wherein the matching network command is calculated in accordance with the matching network adjustment if the changed power loss is smaller than the power loss.

14. A method of operating a magnetic resonance imaging system for acquiring magnetic resonance data, wherein the magnetic resonance imaging system comprises a radio-frequency transmitter for generating radio-frequency pulses during acquisition of the magnetic resonance data, wherein the radio-frequency transmitter has multiple transmit channels, wherein the magnetic resonance imaging system further comprises an impedance matching network adapted for impedance matching the radio-frequency transmitter to a radio-frequency antenna, wherein the radio-frequency antenna comprises multiple antenna elements, the impedance matching network (320, 1402, 1502, 1602) being circuited between the radio-frequency transmitter and the antenna elements and including a tunable controlled coupling/decoupling network between antenna elements, wherein the impedance matching network and the coupling/decoupling network are adjustable remotely, the method including with one or more processors:
measuring a set of radio-frequency properties of the radio-frequency antenna;
calculating a matching network command using the set of radio-frequency properties and a radio frequency model, wherein the radio frequency model is descriptive of the impedance matching network, including the coupling/decoupling network, and the radio-frequency antenna; and
adjusting the impedance matching network, including tuning the coupling/decoupling network between antenna elements, by sending the matching network command to the impedance matching network.

15. The method of claim 14, wherein the magnetic resonance imaging system comprises a magnet with an imaging zone, wherein the magnetic resonance data is acquired from the imaging zone, wherein the method further comprises:
placing a subject at least partially within the imaging zone before measuring the set of radio-frequency properties.

16. The method of claim 14, wherein calculating the matching network command includes with the one or more processors:
determining a B1 shim setting for the radio-frequency transmitter using the magnetic resonance imaging system;
calculating a power loss using the set of radio-frequency properties and the B1 shim settings;
choosing a matching network adjustment;
transforming the set of radio-frequency properties and the B1 shim setting using the radio-frequency model and the matching network adjustment;
calculating a changed power loss using the transformed set of radio-frequency properties and the transformed B1 shim setting; and
wherein the matching network command is calculated in accordance with the coupling/decoupling network tuning if the changed power loss is smaller than the power loss.

17. A radio-frequency antenna configured for acquiring magnetic resonance data, wherein the radio-frequency antenna comprises:
multiple antenna elements, wherein the multiple antenna elements are configured for transmitting;
a remotely controllable impedance matching network configured to connect to a radio-frequency transmitter with multiple transmit channels; and
a remotely tunable coupling/decoupling network connected between pairs of the multiple antenna elements.

18. The radio-frequency antenna of claim 17, wherein the impedance matching network and the coupling/decoupling network are adjusted with a matching network command generated by:
determining a B1 shim setting for a radio-frequency transmitter using a magnetic resonance imaging system;
calculating a power loss using a set of radio-frequency properties and the B1 shim settings;
choosing a matching network adjustment;
transforming the set of radio-frequency properties and the B1 shim setting using a radio-frequency model and the matching network adjustment;
calculating a changed power loss using the transformed set of radio-frequency properties and the transformed B1 shim setting; and
calculating the matching network command in accordance with the impedance matching network and the coupling/decoupling network adjustment if the changed power loss is smaller than the power loss.

* * * * *